United States Patent
Cunningham

(10) Patent No.: US 6,177,703 B1
(45) Date of Patent: Jan. 23, 2001

(54) METHOD AND APPARATUS FOR PRODUCING A SINGLE POLYSILICON FLASH EEPROM HAVING A SELECT TRANSISTOR AND A FLOATING GATE TRANSISTOR

(75) Inventor: James A. Cunningham, Saratoga, CA (US)

(73) Assignee: VLSI Technology, Inc., San Jose, CA (US)

(*) Notice: Under 35 U.S.C. 154(b), the term of this patent shall be extended for 0 days.

(21) Appl. No.: 09/321,792

(22) Filed: May 28, 1999

(51) Int. Cl.[7] .................................................. H01L 29/788
(52) U.S. Cl. ........................................... 257/321; 257/317
(58) Field of Search ..................... 257/318–321, 257/317

(56) References Cited

U.S. PATENT DOCUMENTS

| | | |
|---|---|---|
| 4,830,974 | 5/1989 | Chang et al. . |
| 4,868,629 | 9/1989 | Eitan . |
| 4,877,751 | 10/1989 | Teng et al. . |
| 5,132,239 | 7/1992 | Ghezzi et al. . |
| 5,324,972 * | 6/1994 | Takebuchi et al. .................. 257/321 |
| 5,416,738 | 5/1995 | Shrivastava . |
| 5,464,999 | 11/1995 | Bergemont . |
| 5,482,879 | 1/1996 | Hong . |
| 5,841,165 * | 11/1998 | Chang et al. ......................... 257/320 |
| 5,886,378 * | 3/1999 | Wang .................................... 257/322 |

OTHER PUBLICATIONS

"Nonvolatile Semiconductor Memory Technology", 2.4. Degradation Mechanisms, by William D. Brown and Joe E. Brewer, IEEE, Press 1998, pp. 130–144).

K. Yoshikawa, et al, "A flash EEPROM cell scaling including tunnel oxide limitations", ESSDERC 1990 Tech. Dig., Sep. 1990, pp. 169–172.

Stephen Keeney, et al, "Complete Transient Simulation of Flash EEPROM Devices", IEEE Tran. on Electron Dev., 39, No. 12, 12/92, pp. 2750–2756.

Paolo Pavan, et al, "Flash Memory Cells–An Overview", Proc. IEEE, 85, No. 8, Aug. 1997, pp. 1248–1271.

"An EEPROM for Microprocessor and Custom Logic", Cuppens, R., IEEE J. of Solid state Circuits, vol. SC–20, No. 2, 4/85, pp. 603–608.

Chenming Hu, "Gate Oxide Scaling Limits and Projection", 1996 IEDM, pp. 319–322.

Kow–Ming Chang, et al "A New Simple and Reliable Method to Form a Textured Si Surface for the Fabrication of a Tunnel Oxide Film", IEEE Electron Dev. Letters, 19, No. 5, May 1998, pp. 145–147.

(List continued on next page.)

Primary Examiner—David Hardy
(74) Attorney, Agent, or Firm—Burns Doane Swecker & Mathis L.L.P.

(57) ABSTRACT

Accordingly, exemplary embodiments of the present invention are directed to single poly flash EEPROM cells which avoid the drawbacks of conventional two poly stacked gate cells, and which are easily integrated with high performance logic technologies. An exemplary two transistor flash-EEPROM memory cell array comprises a plurality of these flash EEPROM cells, each having a select transistor with a bit line and a word line, where the select transistor is in series with a floating gate transistor. The floating gate transistor has a thin tunneling oxide formed on a textured monocrystalline substrate. The floating gate is also formed over a heavily doped region in the substrate which forms a coupling line capacitively coupled to the floating gate, and which performs a tunneling function.

5 Claims, 5 Drawing Sheets

OTHER PUBLICATIONS

Hiroshi Nozawa, et al, "An EEPROM Cell Using a Low Barrier Height Tunnel Oxide", IEEE Tran. on Electron Dev., ED–33, No. 2, 2/86, pp. 275–281.

T.Y. Chan and H. Gaw, "Performance and Hot–Carrier Reliability of Deep–Submicrometer CMOS", IEDM'89, pp. 71–74.

Yuan Taur and Edward J. Nowak, "CMOS Devices below 0.1μm: How High Will Performance Go?", IEDM '97, pp. 215–218.

Oxidation of Phosphorus–Doped Low Pressure and Atmospheric Pressure CVD Polycrystalline–Silicon Films by T. I. Kamis, J. Electrochem. Soc., May 1979, pp. 838–844.

A New E(E)PROM Technology With A $TiSi_2$ Control Gate; F. Vollebregt et al, Philips Reseach Laboratories, The Netherlands, IEEE, 1989, IEDM 89–pp. 607–610.

Secondary Electron Flash—A High Performance Low Power Flash Technology for 0.35 μm and Below, J.D. Bude et al, Bell Laboratories, IEEE, 1997, IEDM 97–pp. 279–282.

EEPROM/Flash Sub 3.0V Drain–Source Bias Hot Carrier Writing, J.D. Bude et al, AT&T Bell Laboratories, Dec. 7–10, 1997, IEDM 95–pp. 989–991.

10 Flash Technology, Integrated Circuit Engineering Corporation, Memory 1996; pp. 10–1–10–9.

12 Embedded Memory Technology, Integrated Circuit Engineering Corporation, Memory 1996; pp. 12–1–12–9.

A 512–kb Flash EEPROM Embedded in a 32–b Microcontroller, Clinton Kuo et al, IEEE Journal of Solid–State Circuits, vol. 27, No. 4, Apr. 1992, pp. 574–581.

Characterization of Thin Textured Tunnel Oxide Prepared By Thermal Oxidation Of Thin Polysilicon Film on Silicon, Shye Lin Wu et al, IEEE Transactions On Electron Devices, vol. 43, No. 2, Feb. 1996, pp. 287–294.

A New Erasing Method For A Single–Voltage Long–Endurance Flash Memory, R. Bez et al., IEEE Electron Device Letters, vol. 19, No. 2, Feb. 1998, pp. 37–39.

A Self–convergence Erase For NOR Flash EEPROM Using Avalanche Hot Carrier Injection, Seiji Yamada, IEEE Transactions on Electron Devices, vol. 43, No. 11, Nov. 1996, pp. 1937–1941.

Substrate–Current–Induced Hot Electron (SCIHE) Injection: A New Convergence Scheme For Flash Memory, C. Y. Hu et al, Advanced Micro Devices, Inc., IEEE, 1995, IEDM 95–pp. 283–286.

The Solution Of Over–Erase Problem Controlling Poly–Si Grain Size–Modified Scaling Principles For Flash Memory, S. Muramatsu et al., IEEE, 1994, IEDM 94–pp. 847–850.

Failure Mechanisms of Flash Cell In Program/Erase Cycling, P. Cappelletti et al., IEEE 1994, Dec. 11–14, 1994, IEDM94–pp. 291–294.

A Shallow–Trench–Isolation Flash Memory Technology With A Source–Bias Programing Method, M. Kato et al., IEEE 1996, IEDM 96–pp. 177–180.

A Novel High–Density $5F^2$ NAND STI Cell Technology Suitable for 256Mbit and 1Gbit Flash Memories, K. Shimizu et al., IEEE 1997, IEDM 97–pp. 271–274.

HIMOS—A High Efficiency Flash $E^2PROM$ Cell For Embedded Memory Applications, Jan Van Houdt et al., IEEE Transactions of Electron Devices, vol. 40. No. 12, Dec. 1993, pp. 2255–2265.

A New Cell Structure For Sub–quarter Micro High Density Flash Memory, Y. Yamauchi et al., IEEE 1995, IEDM 95–pp. 267–270.

* cited by examiner

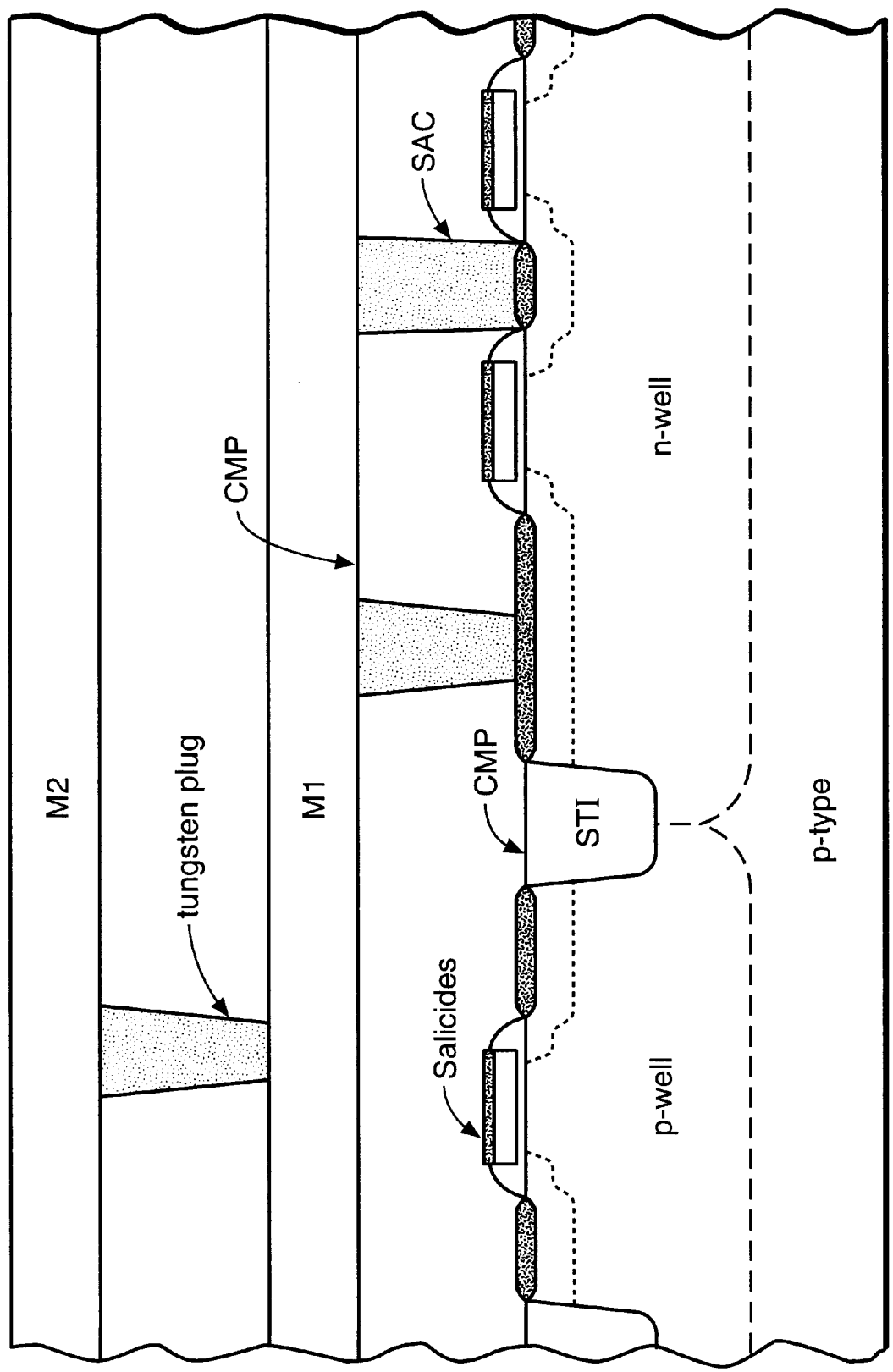
FIG._1A

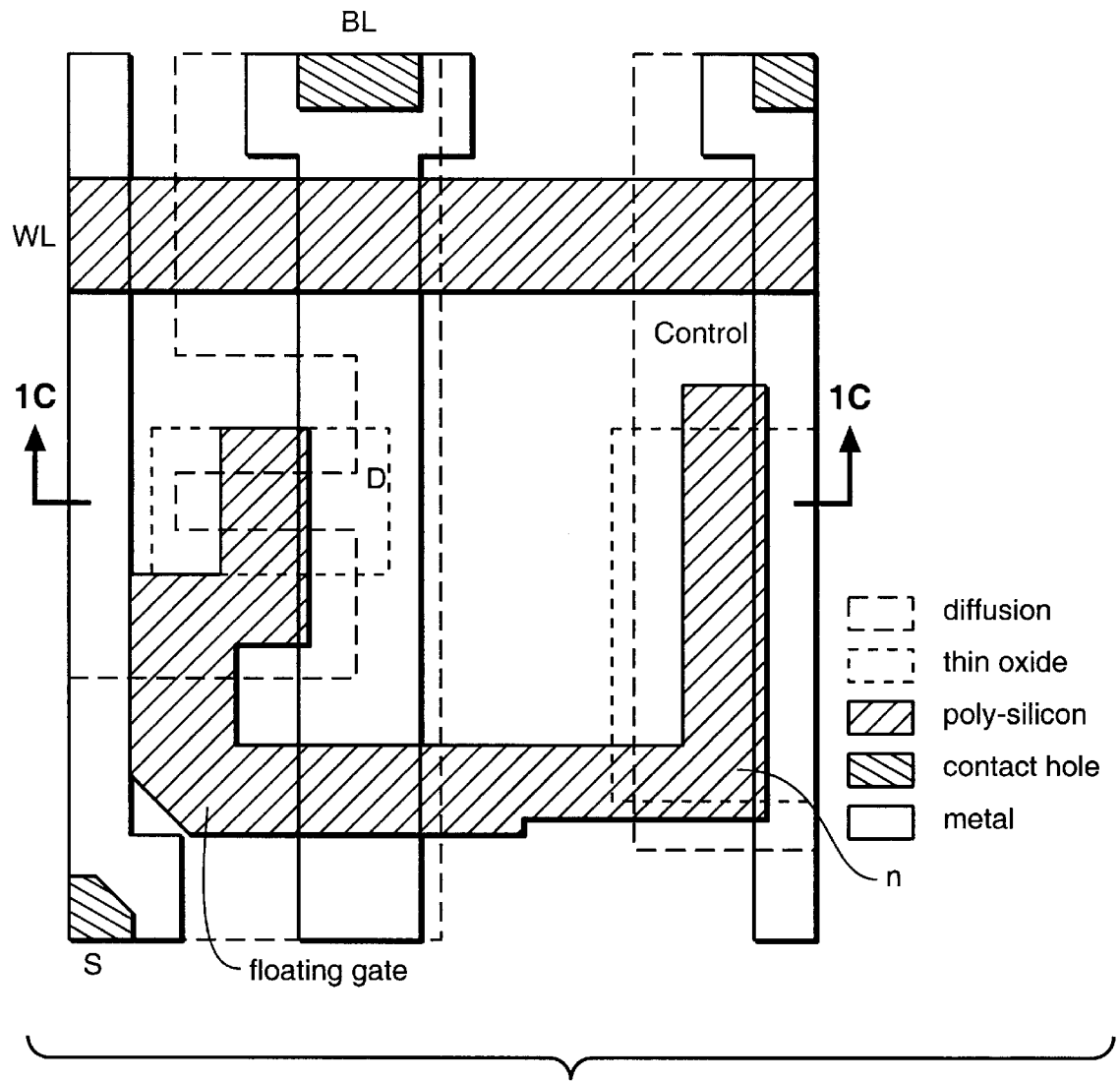
FIG._1B
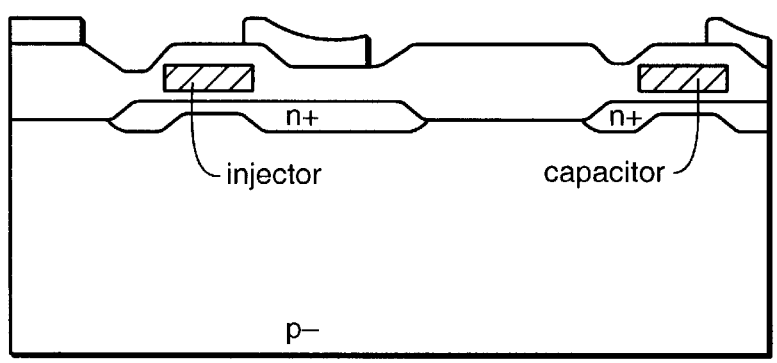
FIG._1C

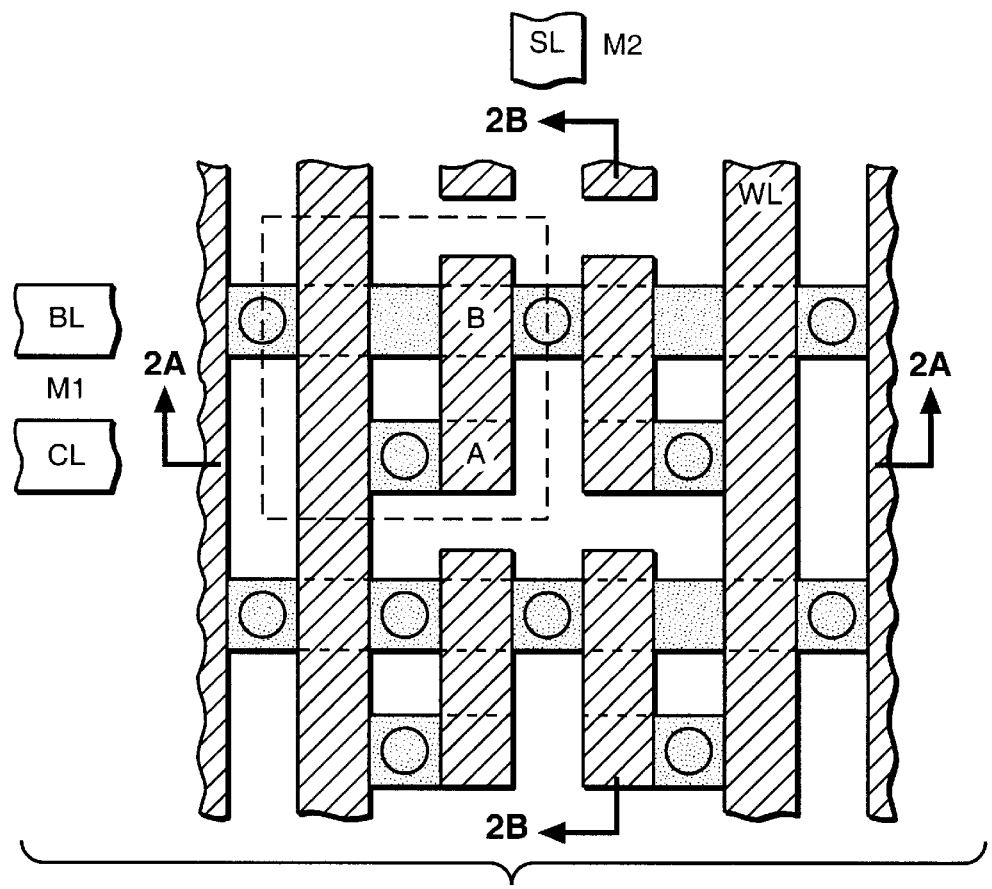
FIG._2
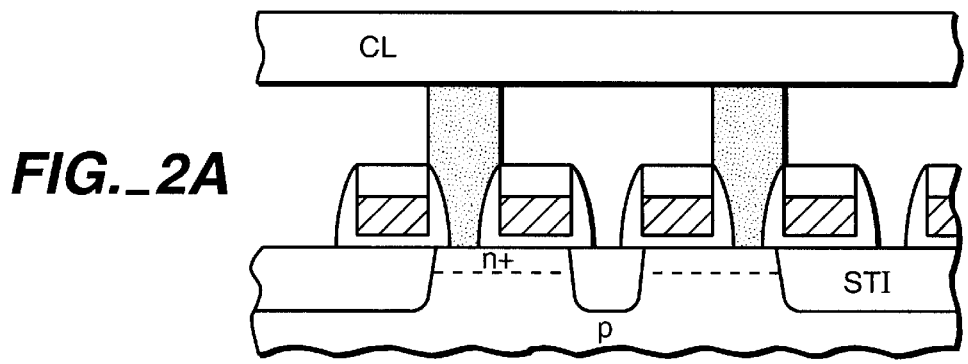
FIG._2A
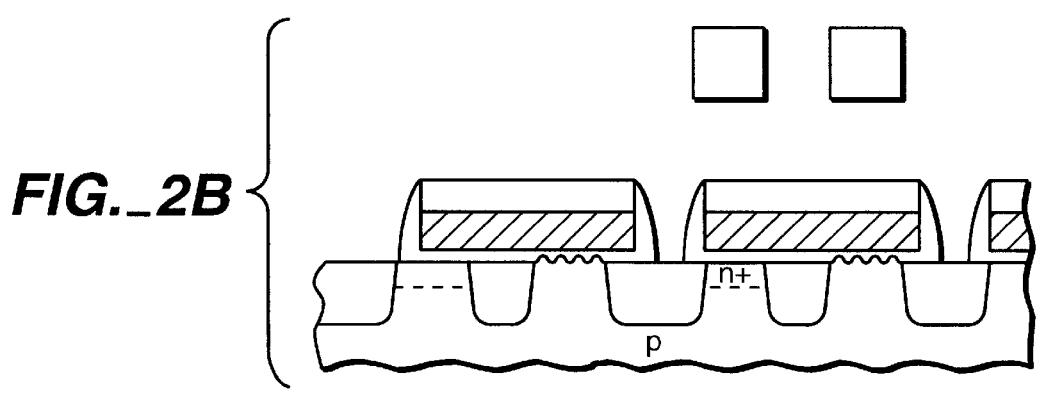
FIG._2B

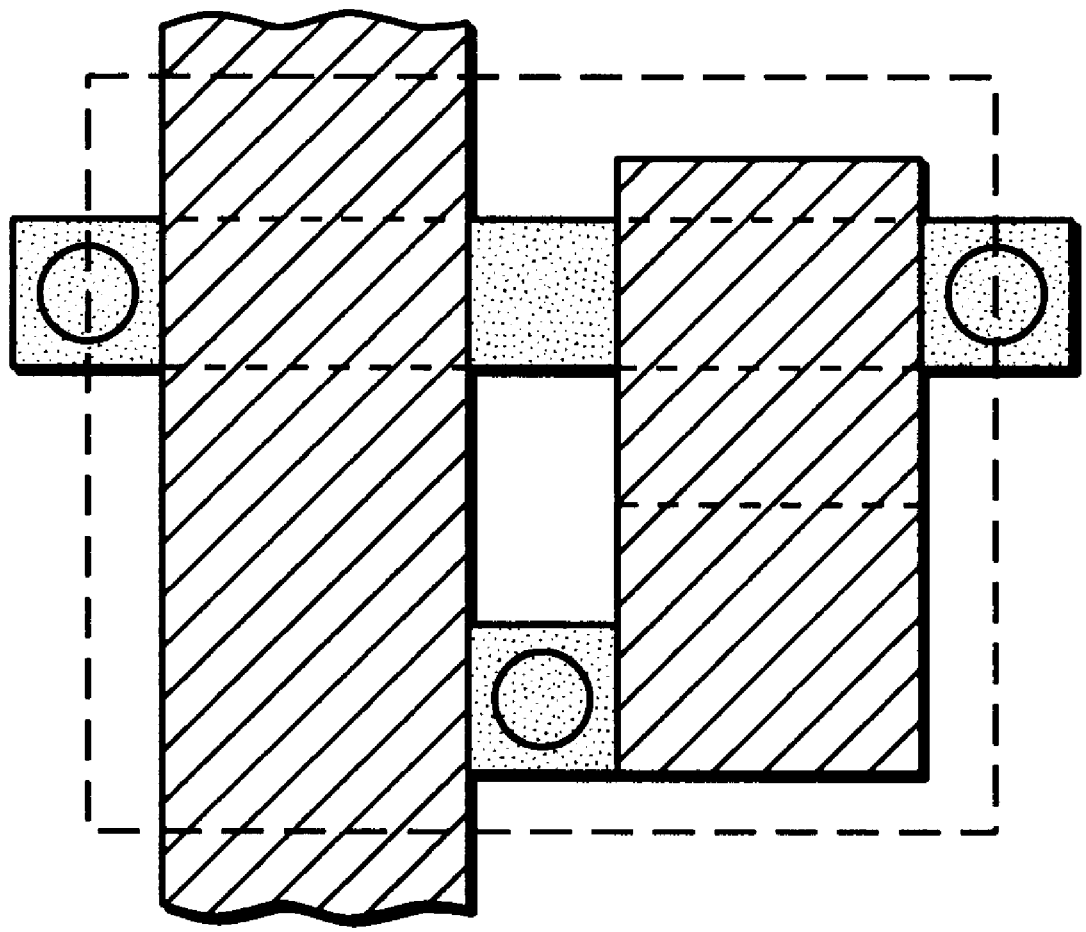
FIG._3

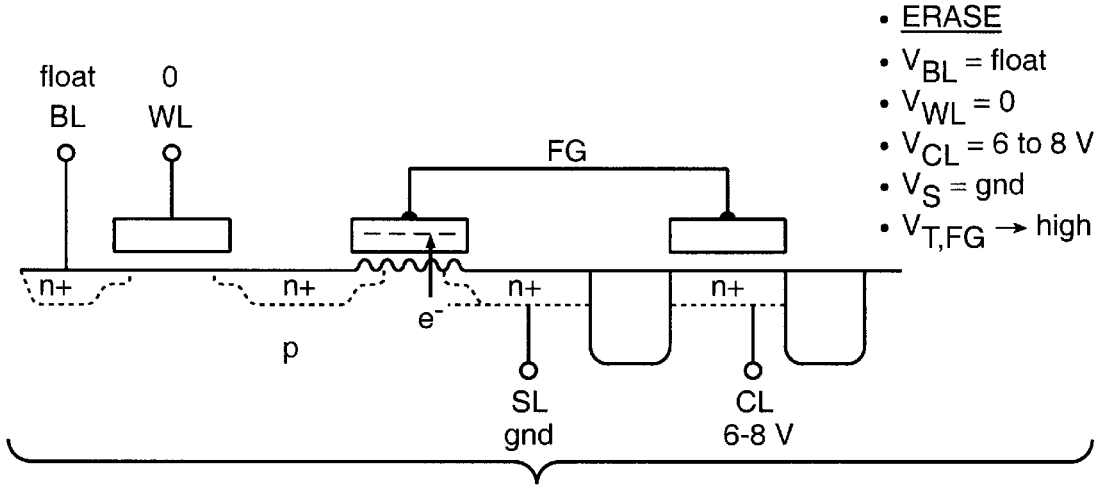
FIG._4A
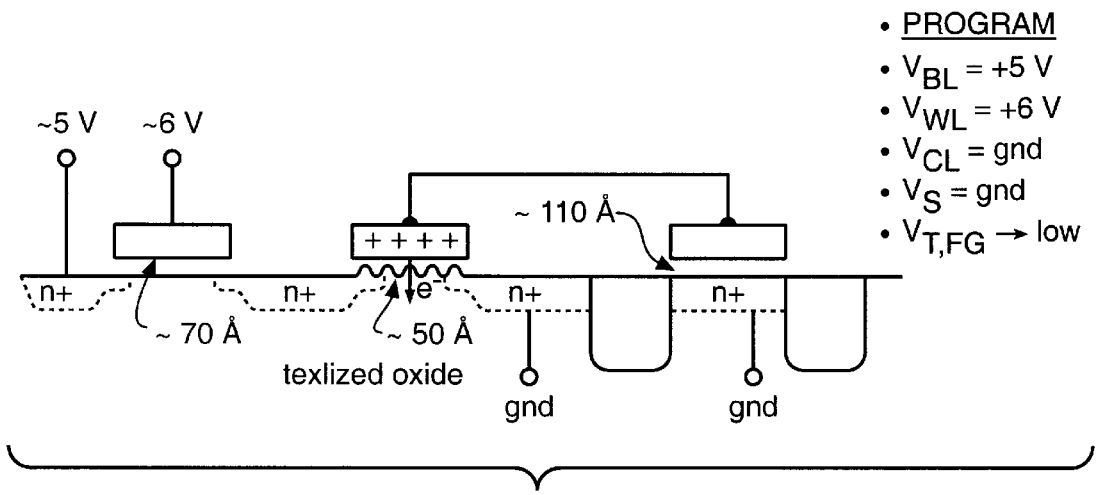
FIG._4B
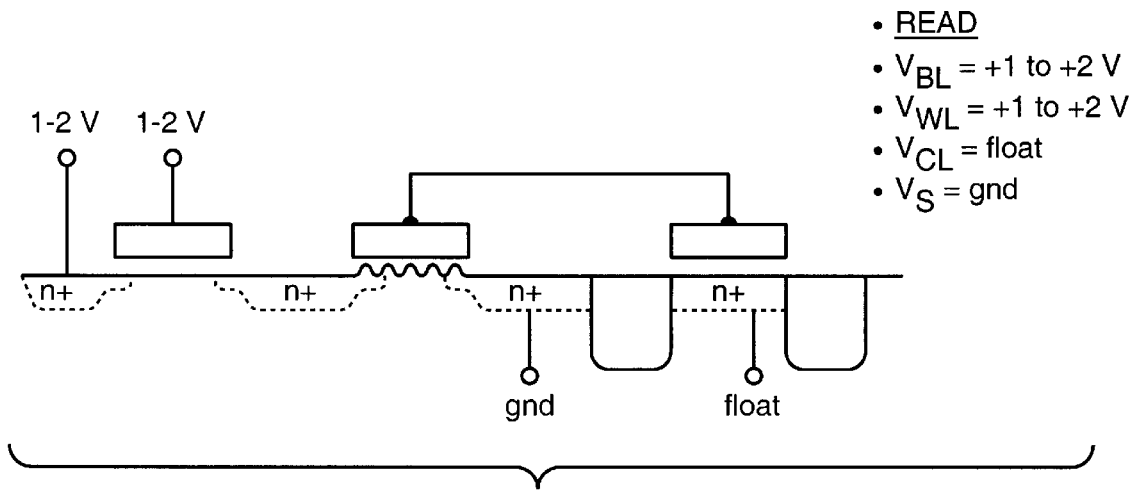
FIG._4C

METHOD AND APPARATUS FOR PRODUCING A SINGLE POLYSILICON FLASH EEPROM HAVING A SELECT TRANSISTOR AND A FLOATING GATE TRANSISTOR

RELATED APPLICATIONS

The present application relates to a co-pending application filed concurrently herewith, entitled: METHOD AND APPARATUS FOR PROVIDING AN EMBEDDED FLASH-EEPROM TECHNOLOGY, application Ser. No. 09/322,172, filed May 28, 1999, the disclosure of which is hereby incorporated by reference in its entirety.

BACKGROUND OF THE INVENTION

1. Field of the Invention

The present invention is generally directed to semiconductor memories, and more particularly, to the development of memory cells which can be easily integrated with high performance logic technologies.

2. State of the Art

Those skilled in the art appreciate the desirability of embedding memory technology such as dynamic random access memories (DRAMs), static random access memories (SRAMs), read-only memories (ROMs), electrically erasable programmable read-only memories (EEPROMs), and flash EEPROMs into high performance logic technologies. However, at present, only technologies such as SRAM and ROM are straightforward to integrate into high performance logic technologies. Technologies, such as EEPROM and DRAM technologies are highly dedicated to their specific needs, and are very complex, rendering them unsuitable for straightforward, easy integration into high performance logic technologies.

Because of the numerous applications which exist for integrating flash EEPROM technology with high performance complementary metal oxide semiconductor (CMOS) logic devices (e.g., microprocessors), the development of such a technology would be highly desirable. For example, the applications for such an integrated technology include software updates, storing identification codes, system reconfiguration in the field, look-up tables, manufacturing codes, non-volatile data storage, smart cards which use flash embedded memory, prototyping and various programmable logic devices and field programmable gate arrays.

Known process technologies do not lend themselves to easy integration of commodity flash EEPROM cells with logic devices, such as high performance CMOS devices. Given the wide applicability of flash EEPROM technology, it would be desirable to avoid the process incompatibility problems associated with integrating typical cell designs with conventional logic devices. For example, EEPROM technology is typically implemented using one of four basic cell types: (1) the one transistor stacked-gate flash EEPROM cell; (2) the one and one half transistor split-gate flash EEPROM cell; (3) the double-gate two transistor EEPROM cell; and (4) cells which use edges for control or select gates. There have also been proposals regarding flash memory cells which form self-aligned trenches at the edge of a partially formed stack-gate structure. However, each of these technologies suffers drawbacks which inhibits their straightforward, easy integration into high performance logic technologies.

In addition to process compatibility problems, scaling EEPROM technology into the 0.25 µm regime and below, as is used on typical high performance logic processes, has not been realized. Those skilled in the art have suggested that scaling EEPROM devices is subject to physical limits which may inhibit a reduction in cell size (see, for example, "Nonvolatile Semiconductor Memory Technology", by William D. Brown and Joe E. Brewer, IEEE, Press 1998, page 130). Although the one-transistor stacked-gate double poly technology produces resultant cells which are relatively small, the process is quite complex.

FIG. 1A illustrates features of a 0.18 µm state-of-the-art high performance logic process which uses approximately 20 photolithography steps, and some five levels of interconnect. It would be desirable to formulate a flash-EEPROM cell and technology suitable for embedded applications, which requires a minimum perturbation to the high performance logic technology, and which does not compromise logic function performance. The EEPROM cell should be compatible with deep submicron dimensions and technology. Features of conventional high performance logic technology include use of shallow-trench isolation (STI), use of chemical mechanical polish (CMP), values of transistor length L=0.18 to 0.25 µm, salicides (usually Ti-based), gate oxides 45–55 Å, $V_d$=1.8–2.5V, tungsten plugs with Ti/TiN liner, aluminum alloy interconnects with Ti/TiN barrier and TiN ARC, $V_T$ values down to about ¼ V, silicon nitride spacers for lightly doped drains, and dual-poly gate electrodes (p+ for p-channel and n+ for n-channel). Self-aligned contacts (SAC) or borderless contacts are generally seen in DRAMs and SRAMs at this technology level.

As gate oxide thicknesses and effective source-to-drain diffusion separation lengths (Leff) have scaled downward, transistor performance has been greatly enhanced. For example, with hot electron channel injection (HECI), programming times have been reduced about two orders of magnitude in moving from 1 µm to 0.25 µm technology. See, for example, K. Yoshikawa, et al, "A flash EEPROM cell scaling including tunnel oxide limitations", ESSDERC 1990 Tech. Dig., 1990, pg. 169 via Stephen Keeney, et al, "Complete Transient Simulation of Flash EEPROM Devices", IEEE Tran. on Electron Dev., 39, No. 12, December 1992, pg. 2750.

A programming time of about $10^{-5}$ seconds is possible for commodity flash memories using technologies below 0.5 µm. See, for example, R. Bez, et al, "The channel hot electron programming of a floating gate MOSFET: An analytical study", $12^{th}$ Nonvolatile Semiconductor Memory Workshop, Monterey, Calif., August 1992 via Paolo Pavan, et al, "Flash Memory Cells-An Overview", Proc. IEEE, 85, No. 8, August 1997, page 1248. With this speed, the programming of one million bits would require about 10 seconds.

However, the downward scaling of MOSFETs used for high performance logic has been somewhat more aggressive than that of flash EEPROMS. For logic, both voltage levels and gate oxide thicknesses are less, as compared to flash technology. Thus, it would be desirable to further scale down flash EEPROM technology to render it more compatible with high performance logic technology.

In addition, it would be desirable to provide a compact flash EEPROM cell which only requires one level of poly, yet which is free of the over erase problem associated with, for example, multiple poly cells (e.g., two poly stacked-gate flash EEPROM cells). A maximum cell size of about 40 $f^2$ would be desirable, wherein the parameter f is the minimum feature size. Using 0.25 µm technology, for example, 2 Mbits of flash memory of this cell size would occupy only about 5% (core area only) of a 1 $cm^2$ chip.

Although single-poly flash EEPROM cells are known, they are relatively large, and are not easily integrated into a high performance technology. For example, a single-poly flash EEPROM cell is disclosed in "An EEPROM for Microprocessor and Custom Logic", by Cuppens, R., IEEE J. of Solid state Circuits, Vol. SC-20, No. 2, April 1985, page 603. This cell, as shown in FIGS. 1B–1C, couples an n+ region in the substrate to a leg of the floating gate. By applying 13V to the n+, via a metal contact, electrons can be drawn from a thin oxide "injector" region "D". However, the cell area is very large (i.e., approximately 140 $f^2$).

Another single poly EEPROM cell disclosed in U.S. Pat. No. 5,132,239 has a selection transistor and a floating gate which is capacitively coupled to an n+ region. The cell has a thin oxide region for tunneling electrons. The cell is erased by taking the bit line to ground and the control gate high. Electrons flow to the floating gate, turning off a second transistor connected in series to the selection transistor. The cell is programmed by pulsing the bit line high while holding the control gate at ground. Electrons flow from the floating gate lowering the threshold voltage and turning on the second transistor. However, from the cell drawing in the patent, the area is roughly 100 $f^2$, which is relatively large.

The known single poly cells use a selection transistor (forming a two transistor cell), and thereby free the device of the over erase problem typical of the two-poly single-transistor stacked gate cells. However, known single poly cells both program and erase through the thin tunneling oxide. In addition, these cells have both "injector" and floating gate regions between the source and drain of the selection transistors, which increases the cell area.

SUMMARY OF THE INVENTION

Accordingly, exemplary embodiments of the present invention are directed to single poly flash EEPROM cells which avoid the drawbacks of conventional two poly stacked gate cells, and which are easily integrated with high performance logic technologies. An exemplary two transistor flash-EEPROM memory cell array comprises a plurality of these flash EEPROM cells, each having a select transistor with a bit line and a word line, where the select transistor is in series with a floating gate transistor. The floating gate transistor has a thin tunneling oxide formed on a textured monocrystalline substrate. The floating gate is also formed over a heavily doped region in the substrate which forms a coupling line capacitively coupled to the floating gate, and which performs a tunneling function.

Exemplary embodiments use only one floating gate electrode between the source and drain, giving a simpler and smaller cell. Exemplary embodiments also use textured substrate tunnel-oxide technology to significantly lower programming and erase voltages, thus increasing the compatibility of flash-EEPROM technology to deep sub-micron higher performance logic processes.

An exemplary method of forming a single-poly, textured substrate two-transistor flash-EEPROM memory cell array comprises establishing a select transistor with a bit line and a word line on a substrate, establishing a floating gate transistor in series with said select transistor on said substrate, forming a thin tunneling oxide on a textured monocrystalline substrate, with the floating gate transistor placed over a heavily doped region in the substrate and forming, with the heavily doped region, a coupling line which is capacitively coupled to said floating gate which performs a tunneling function.

Generally speaking, exemplary embodiments of the present invention relate to a flash-EEPROM memory cell, and process for producing such a memory cell, wherein the memory cell includes: a select transistor formed from a first polysilicon layer with a bit line and a word line; a floating gate transistor formed from said first polysilicon layer, connected in series with said select transistor, said floating gate transistor having a tunneling oxide formed on a textured monocrystalline substrate; and a heavily doped region formed in said substrate, said floating gate being formed over said heavily doped region, said heavily doped region forming a coupling line capacitively coupled to said floating gate. Such a cell can be included in a memory cell array comprising a plurality of such cells.

BRIEF DESCRIPTION OF THE DRAWINGS

The foregoing and other objects and features of the present invention will become more apparent from the following detailed description of preferred embodiments when read in connection with the accompanying drawings, wherein:

FIGS. 1A–1C illustrate a conventional high performance logic technology, and a conventional single-poly flash EEPROM cell;

FIGS. 2, 2A and 2B illustrate an exemplary single-poly flash EEPROM cell configured in accordance with the present invention;

FIG. 3 illustrates an exemplary single-poly flash EEPROM cell configured with a wider word line and higher coupling ratio in accordance with an exemplary embodiment of the present invention; and FIGS. 4A–4C illustrate exemplary erase, program and read functions for a single-poly flash EEPROM cell configured in accordance with an exemplary embodiment of the present invention.

DETAILED DESCRIPTION OF THE PREFERRED EMBODIMENTS

Exemplary embodiments of the present invention use Fowler-Nordheim tunneling instead of hot electron channel injection to achieve exemplary programming times of about $5 \times 10^{-4}$ to about $10^{-5}$ seconds per cell. In an exemplary embodiment of the present invention, a flash EEPROM cell is compatible with approximately 0.18 $\mu$m high performance logic technology. Gate oxide thicknesses and applied voltages have been selected such that the resulting electric fields do not exceed dielectric breakdown or time-degration limits.

In a paper by Chenming Hu, "Gate Oxide Scaling Limits and Projection", 1996 IEDM, pg. 319, minimum MOSFET gate oxide thicknesses are given vs. maximum applied voltages for a ten year life at 125 degrees Celsius. This data can help define maximum electric fields in a cell implemented in accordance with the present invention.

An exemplary cell of the present invention uses textured substrate tunneling oxides as discussed in Kow-Ming Chang, et al "A New Simple and Reliable Method to Form a Textured Si Surface for the Fabrication of a Tunnel Oxide Film", IEEE electron Dev. Letters, 19, No. 5, May 1998, pg. 145. In this method a tunnel oxide is formed by oxidizing completely through a thin polysilicon film lying directly on monocrystalline silicon. This forms a textured surface on the single crystal substrate. After stripping the oxide, an oxide formed on this roughed silicon exhibits enhanced tunneling currents. Furthermore, the dielectric strength is significantly improved over oxides (poly ox) formed on textured poly.

For the textured substrate oxides, current densities are much higher from positively charged electrodes. That is, currents are higher when tunneling in the direction of electron emission from the substrate. This effect is used herein in erasing at lower voltages.

FIGS. 2A and 2B show a top side layout and two cross sectional views of one embodiment of a flash cell in accordance with the present invention. The process features self-aligned tungsten-plug contacts, double level metal, and shallow trench isolation. The cell has an area of about 18 $f^2$.

In the cell shown, the n+ substrate area coupled to the poly 1 floating gate (marked A) is equal to the floating gate tunnel oxide transistor (marked B) area. If a tunnel oxide at B were 50 Å and the coupling oxide at A were 110 Å, then the coupling ratio is about $[1/110]/[1/110+1/50]=0.31$. For example, if 8V were applied to the n+ control line then the floating gate would go to about 2.5V. For a 50 Å oxide, this would produce an electric field at B over the source line of about $5.0 \times 10^6$ V/cm, and a tunneling current of about $5 \times 10^{-4}$ A/cm$^2$.

This value may be used to calculate the erase time. Since $VC_o=Jt$, where V is the voltage on a capacitor with capacitance per unit area Co, J is the current density and t is time, plugging in 2V (that is, a 2V increase in $V_T$), and Co for a capacitor using 50 Å of $SiO_2$, the value of t is only 0.01 seconds. But since the underlying n+ source area might only be about one half the total floating gate thin oxide area due to misalignment, this simple calculation might be low by about a factor of two. Tunneling currents into the p-type substrate channel region would be low because the flat band voltage of about 1V reduces the electric field there.

For an 8V erase voltage, an electric field of about $7.3 \times 10^6$ V/cm exists across the 110 Å oxide. This would give a tunneling current of about $10^{-7}$ A/cm$^2$, which is about 5000× less than the textured substrate tunneling current for the case of the 0.31 coupling ratio cell. In Hiroshi Nozawa, et al, "An EEPROM Cell Using a Low Barrier Height Tunnel Oxide", IEEE Tran. on Electron Dev., ED-33, No. 2, February 1986, pg. 275, it has been shown that tunneling currents are enhanced if the oxides are grown on n+ substrates due to a reduction in the barrier height of the oxide/silicon conduction band. This data indicates that leakage at the n+ to floating gate coupling region for 110 Å oxides at 8V can be on the order of 10 to 50 times higher.

The n+ control line region should have sufficient doping concentration that the surface does not invert at 8V. A phosphorus or arsenic concentration of about $10^{20}$ atoms/cm$^3$ would be more than adequate to prevent inversion.

To program the cell, an inversion layer, positively charged, may be formed under the floating gate (region B) by turning the transistor on and grounding the n+ control and source lines. Since this is in the hard direction of tunneling current flow, about 5V would have to be applied to the bit line and a voltage somewhat over this applied to the word line. For 0.18 $\mu$m technology, such a voltage is close to punch through and junction breakdown conditions. For this reason, FIG. 2 for 0.18 $\mu$m gate length technology, may be somewhat more dense than practicable for some processes. The word line width may be simply adjusted upward to 2f, for example, and the cell area would increase to about 22.5 $f^2$.

Another embodiment of the present invention provides higher coupling, since this would allow a voltage reduction on the n+ coupling line. A cell with a higher coupling factor may be seen in FIG. 3. This cell has a 2f wide word line and has a coupling ratio of about 0.48 for a cell area of 33 $f^2$. With the larger coupling ratio, the erase voltage would be reduced to about 6V.

The adjustment in gate length is a function, of course, of the exact transistor configuration and process chosen for the high performance logic needs. The well known hot electron problem, which might require gate lengths of 0.5 $\mu$m or more to assure reliability over a ten year life, as described in T. Y. Chan and H. Gaw, "Performance and Hot-Carrier Reliability of Deep-Submicrometer CMOS", IEDM '89, pg. 89, See also Yuan Taur and Edward J. Nowak, "CMOS Devices below 0.1 $\mu$m: How High Will Performance Go?", IEDM '97, pg. 215, is not a concern since the 5V $V_D$ used on the selection transistor is only applied for programming.

FIGS. 4A–4C illustrate partial cross-sectional structures configured in accordance with the present invention to aid in describing voltages which can be applied to the single poly cell for erase, program and read functions. The erase function of FIG. 4A can be applied to the entire array simultaneously and is accomplished by applying a high voltage to the n+ control line (CL). Depending on the coupling ratio, this voltage can vary from about 6V to about 8V. Electrons are tunneled from the textured substrate raising the $V_T$ to about 1 or 2 volts. The erase function is in the easy direction of electron flow but loss of the final charge accumulated on the floating gate is in the hard direction, thereby improving lifetime. In an exemplary embodiment, a 3V potential on the floating gate provides a tunneling current of at least $10^{-4}$ A/cm$^2$. For a 2V shift in threshold, this would require about 0.01 seconds, using a 50 Å tunneling oxide.

The programming function of FIG. 4B is accomplished by forming an n-type inversion layer under the floating gate at a potential of about 5V. This forms an electric field of about $10^7$ V/cm giving a tunneling current of about $10^{-2}$ A/cm$^2$. For a 2V shift in $V_T$, about $10^{-4}$ seconds would be required. Programming brings the $V_T$ of the floating gate transistor to about +¼V. The thin oxide thicknesses are shown in angstroms (Å).

The read function depicted in FIG. 4C can be performed at low voltages, assuring little read disturb or hot electron problems.

An exemplary process flow (selected major steps) for producing an embedded flash EEPROM cell in accordance with the present invention, such as that of FIG. 2 (i.e., 0.18–0.25 $\mu$m CMOS with single-poly embedded flash-EEPROM), is as follows:

Starting with 4–9 ohm-cm p-type silicon, form a nitride film, and then etch shallow trenches for shallow trench oxidation. Oxidize the exposed surface (e.g., about 200 Å), and fill with SiO$_2$ using chemical vapor deposition. Chemical mechanical polish (CMP) the surface to the nitride layer, then strip the nitride. Grow a sacrificial oxide, form an n-well mask, and then implant the n-well with phosphorus, using high energy, and a dose in the $10^{13}$ cm$^{-2}$ range. Next form a p-well mask, and ion implant boron, at high energy, and a dose in the $10^{13}$ cm$^{-2}$ range. Other implants, such as a n-MOS punchthrough and a threshold ($V_T$) adjust can also done at this time. Next form a flash control-capacitor area mask, and ion implant phosphorus into control capacitor area at a dose of about =$10^{15}$ cm-2.

To form a textured substrate, the sacrificial oxide is stripped, and a thin poly layer (e.g., approximately 120 Å) is deposited. A photoresist mask of the poly film in the floating gate transistor area can be formed, and used to etch the poly 1 layer. The exposed surfaces can be thermally oxidized (e.g., about 300 Å), the oxide stripped, and a gate oxide grown (e.g., about 40 Å); (for example, about 35 min. @ 800 deg. C in dry O$_2$). A gate oxide strip mask is then formed. (Open in most logic transistor areas).

To obtain two oxide thicknesses, the gate oxide is stripped in all logic transistor gate areas except high voltage transistors. Oxide is retained in the memory select gate area and in the control gate area. The oxide is stripped in the tunnel floating gate area. The gate oxide is then regrown (e.g., about 50 Å, which requires about 50 min.). About 70 Å is formed in high voltage transistor areas, flash EEPROM select-gate areas, and about 110 Å in n+ flash control gate areas. Known techniques, such as described in "Oxidizing Poly and Single Crystal Silicon" by T. I. Kamis, J. Electrochem. Soc., May 1979, page 804; U.S. Pat. No. 4,877,751 and U.S. Pat. No. 5,132,239, all of which are hereby incorporated by reference, can be used to accelerate oxide growth on n+ areas.

Next polysilicon is deposited, and the poly is doped n+ and p+ with appropriate masks. A cap oxide is then deposited, and n and p-channel LDD transistors are formed with spacers as is well known in the art (e.g., spacers can be nitride to facilitate self aligned contacts (SAC)). Halo implants can be employed to suppress punch through as is well known in the art. The cap oxide is stripped in logic areas using ion assisted plasma etching and appropriate masking. A salicide process is applied in logic area (excluded in flash area by use of oxide masking). Dielectric films are then deposited and planarized. Contacts are opened, tungsten plugs deposited, and then a chemical mechanical polish can be used to planarize the device. Multiple levels of interconnect can then be formed in known fashion.

Table 3 compares an exemplary single poly cell of the present invention to an attempt to use the standard stacked-gate flash cell in an embedded application. It can be seen that the single poly cell has four less major-process modules.

TABLE 3

| Stacked Gate | Single Poly |
| --- | --- |
| Commodity flash devices typically use triple well structures | Standard twin well possible |
| Deep source mask and implant (May be done before poly 1 formation | Comparable step is CL n + masking and implant |
| Poly 2 dep., mask, etch, dope | Not required |
| ONO formation | Formation of textured substrate tunnel oxide roughly comparable |
| Poly 1 and 2 self aligned mask and etch | Not required |

TABLE 3-continued

| Stacked Gate | Single Poly |
| --- | --- |
| Self aligned source mask and etch. Removes field oxide | Not required |

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A flash-EEPROM memory cell, comprising:
    a select transistor formed from a first polysilicon layer with a bit line and a word line;
    a floating gate transistor formed from said first polysilicon layer, connected in series with said select transistor, said floating gate transistor having a tunneling oxide formed on a textured monocrystalline substrate; and
    a heavily doped region formed in the substrate, said floating gate being formed over said heavily doped region, said heavily doped region forming a coupling line capacitively coupled to said floating gate.

2. The flash-EEPROM memory cell of claim 1, wherein said memory cell is configured to erase charge stored therein by applying voltage to a control line of said floating gate transistor, and grounding a source of said floating gate transistor.

3. The flash-EEPROM memory cell of claim 1 wherein said memory cell is configured to store charge therein by applying a positive voltage to said bit line and said word line, and by grounding a source of the floating gate transistor.

4. The flash-EEPROM memory cell of claim 1, wherein said memory cell has a single layer of polysilicon.

5. The flash-EEPROM memory cell of claim 4, comprising:
    a control line and a source line, wherein said bit line, control line, and source line are implemented in overlying conductive interconnects.

* * * * *